(12) United States Patent
Lao et al.

(10) Patent No.: US 12,412,805 B2
(45) Date of Patent: Sep. 9, 2025

(54) SEMICONDUCTOR PACKAGE

(71) Applicant: Taiwan Semiconductor Manufacturing Company, Ltd., Hsinchu (TW)

(72) Inventors: Chen-Hsiang Lao, New Taipei (TW); Yuan-Sheng Chiu, Miaoli (TW); Hung-Chi Li, Taipei (TW); Shih-Chang Ku, Taipei (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/648,466

(22) Filed: Apr. 28, 2024

(65) Prior Publication Data
US 2024/0282659 A1    Aug. 22, 2024

Related U.S. Application Data

(62) Division of application No. 17/461,920, filed on Aug. 30, 2021, now Pat. No. 11,996,342.

(51) Int. Cl.
*H01L 23/40*    (2006.01)
*H01L 23/34*    (2006.01)

(52) U.S. Cl.
CPC ........ *H01L 23/4006* (2013.01); *H01L 23/345* (2013.01); *H01L 2023/4087* (2013.01)

(58) Field of Classification Search
CPC ....... H01L 23/36–3738; H01L 23/4006; H01L 23/4087; H01L 25/10–13
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2013/0154081 A1* | 6/2013 | Kadoguchi | H01L 24/37 257/712 |

* cited by examiner

*Primary Examiner* — Steven B Gauthier
*Assistant Examiner* — Candice Chan
(74) *Attorney, Agent, or Firm* — JCIPRNET

(57) ABSTRACT

A semiconductor package includes a first heat dissipation plate, a second heat dissipation plate, a plurality of heat generating assemblies, and a plurality of fixture components. The first heat dissipation plate has a first upper surface and a first lower surface. The first heat dissipation plate includes first through holes extended from the first upper surface to the first lower surface. The second heat dissipation plate has a second upper surface and a second lower surface. The second heat dissipation plate includes second through holes extended from the second upper surface to the second lower surface. The heat generating assemblies are disposed between the first heat dissipation plate and the second heat dissipation plate. The fixture components include fix screws and nuts. The fix screws penetrate through the first heat dissipation plate and the second heat dissipation plate along the first through holes and the second through holes.

12 Claims, 15 Drawing Sheets

SEMICONDUCTOR PACKAGE

CROSS-REFERENCE TO RELATED APPLICATION

This application is a divisional application of and claims the priority benefit of a prior application Ser. No. 17/461,920, filed on Aug. 30, 2021 and now allowed. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging (e.g., formation of redistribution circuit structure/layer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
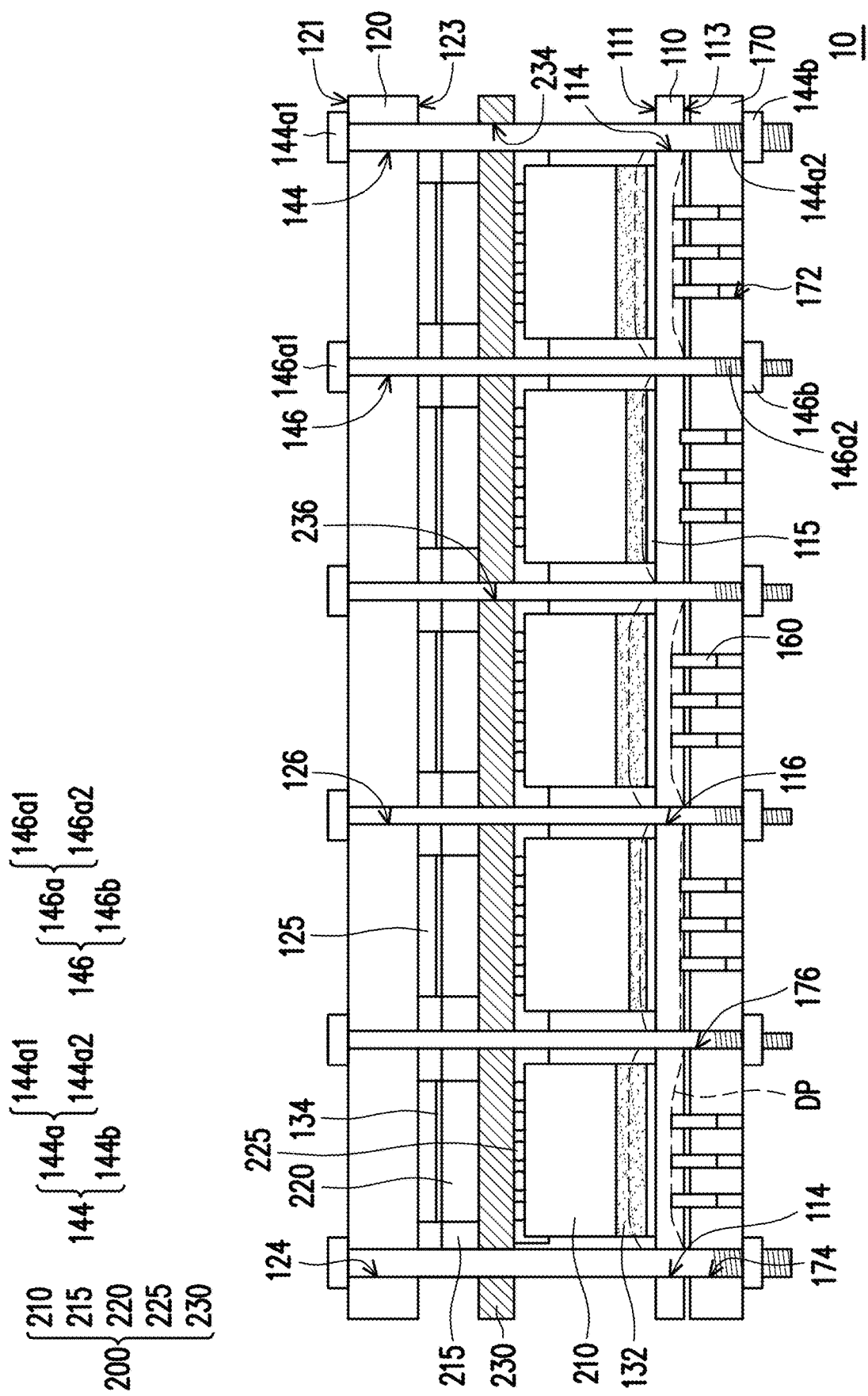
FIG. 1 is a schematic view illustrating a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic view illustrating a semiconductor package 10 in accordance with some embodiments of the disclosure. In some embodiments, the semiconductor package 10 includes a first heat dissipation plate 110, a second heat dissipation plate 120, a plurality of heat generating assemblies 200, and a plurality of fixture components 144, 146.

In some embodiments, as shown in FIG. 1, the first heat dissipation plate 110 has a first upper surface 111 and a first lower surface 113. Moreover, the first heat dissipation plate 110 includes first through holes 114, 116, and each of the first through holes 114, 116 is extended from the first upper surface 111 to the first lower surface 113.

In the present embodiment, the second heat dissipation plate 120 has a second upper surface 121 and a second lower surface 123. As shown in FIG. 1, the second heat dissipation plate 120 includes second through holes 124, 126. In some embodiments, each of the second through holes 124, 126 is extended from the second upper surface 121 to the second lower surface 123 and respectively aligned with the first through holes 114, 116.

In some embodiments, the heat generating assemblies 200 are respectively disposed between the first heat dissipation plate 110 and the second heat dissipation plate 120. Referring to FIG. 1, each of the heat generating assemblies 200 includes a first heat generating component 210 and a second heat generating component 220. In some embodiments, the first heat generating component 210 is, for example, a voltage regulator module (VRM), and the second heat generating component 220 includes, for example, a semiconductor die. In some embodiments, the VRM 210 is disposed on the first upper surface 111 of the first heat generating plate 110, and the semiconductor die 220 is disposed on the second lower surface 123 of the second heat generating plate 120.

Referring to FIG. 1, in some embodiments, the fixture components 144, 146 respectively include fix screws 144a, 146a and nuts 144b, 146b. As shown in FIG. 1, the fix screws 144a, 146a respectively include screw heads 144a1, 146a1 and tread portions 144a2, 146a2 connected with each other. The fix screws 144a, 146a respectively penetrate through the first heat dissipation plate 110 and the second heat dissipation plate 120 along the first through holes 114, 116 and the second through holes 124, 126. In addition, the thread portions 144a2, 146a2 are respectively threaded with the nuts 144b, 146b and protruded therefrom along a direction away from the first heat dissipation plate 110.

In some embodiments, referring to FIG. 1, the screw heads 144a1, 146a1 of the fix screws 144, 146 are pressed against the second upper surface 121 of the second heat dissipation plate, and the nuts 144b, 146b are fastened with the thread portions 144a2, 146a2 through applying various torques to fixedly secure the heating generating assemblies 200 between the first heat dissipation plate 110 and the second heat dissipation plate 120.

In some embodiments, the semiconductor package 10 further includes a back plate 170. The back plate 170 is disposed below the first lower surface 113 of the first heat dissipation plate 110. Referring to FIG. 1, the first heat dissipation plate 110 is disposed between the VRMs 210 of the heat generating assemblies 200 and the back plate 170. As shown in FIG. 1, the tread portions 144a2, 146a2 of the fix screws 144, 146 respectively penetrate through the back plate 170, and the tread portions 144a2, 146a2 are protruded from the bottom of the back plate 170. In some embodiments, as illustrated in FIG. 1, the back plate 170 includes through holes 174, 176, and the tread portions 144a2, 146a2 are inserted through the through holes 174, 176 and protruded therefrom.

In some embodiments, the nuts 144b, 146b are respectively treaded with the thread portions 144a2, 146a2 in different strokes and pressed against the bottom of the back plate 170 to securely fasten the back plate 170 to the first heat dissipation plate 110 and the heat generating assemblies 200. Referring to FIG. 1, the back plate 170 further includes through vias 172 disposed between the through holes 174, 176. In the present embodiments, the semiconductor package 10 also includes a plurality of stop screws 160 respectively accommodate in the through vias 172. In some embodiments, the stop screws 160 are respectively pressed against the first lower surface 113 of the first heat dissipation plate 110 to upwardly push the first heat dissipation plate 110 to the deformed positions for uniformly contacting the bottoms of the VRMs 210. In some embodiments, the back plate 170 can be formed by for example a stainless-steel material having greater hardness to avoid being deformed by the press forces applied from the fixture components 144, 146.

In some embodiments, referring to FIG. 1, the first heat dissipation plate 110 further includes first lug bosses 115 formed on the first upper surface 111, and the VRMs 210 are respectively disposed on the first lug bosses 115. In some embodiments, a first thermal interface material (TIM) layer 132 is disposed between the VRMs 210 and the first lug bosses 115 to enhance thermal dissipation. In some embodiments, a vertical height of the of the first lug bosses 115 from the first upper surface 111 is in a range from about 1 mm to about 3 mm.

In some embodiments, as shown in FIG. 1, the second heat dissipation plate 120 can include second lug bosses 125 formed on the second lower surface 123, and the semiconductor dies 220 are respectively disposed on the second lug bosses 125. In some embodiments, a second thermal interface material (TIM) layer 134 is disposed between the semiconductor dies 220 and the second lug bosses 125. In some embodiments, a vertical height of the of the second lug bosses 125 from the second lower surface 123 is in a range from about 1 mm to about 3 mm.

As shown in FIG. 1, the semiconductor dies 220 are respectively encapsulated by insulating encapsulation material 215. In some embodiments, the insulating encapsulation material 215 is a molding compound formed by a molding process. In some embodiments, the insulating encapsulation material 215, for example, may include polymers (such as epoxy resin, phenolic resins, silicon-containing resins, or other suitable resins), and dielectric materials having low permittivity (Dk) and low loss tangent (Df) properties, or other suitable materials. In some embodiments, a wafer substrate 230 is disposed between the VRMs 210 and the semiconductor dies 220. In some embodiments, a plurality of connecting elements 225 can be further disposed between the VRMs 210 and the wafer substrate 230 to form conductive connections therebetween. In some embodiments, the connecting elements 225 are also encapsulated by the insulating encapsulation material 215.

In the present embodiments, the nuts 144b, 146b are treaded with the tread portions 144a2, 146a2 of the fix screws 144a, 146a by various applied torques, so that the screw heads 144a1, 146a1 and the nuts 144b, 146b are respectively pressed against the first lower surface 113 and the second upper surface 121 to uniformly attach the first lug bosses 115 and the second lug bosses 125 respectively to the bottom of VRMs 210 and the upper surfaces of the semiconductor dies 220 through the first TIM layer 132 and the second TIM layer 134.

In some embodiments, the first TIM layer 132 and the second TIM layer 134 respectively include thermal conductive polymer materials for enhancing thermal conduction or thermal dissipation across the interfaces between the bottoms of the VRMs 210 and the first lug bosses 115 of the first heat dissipation plate 110 and between the upper surfaces of the semiconductor dies 220 and the second lug bosses 125 of the second heat dissipation plate 120. Hence, the VRMs 210 and the semiconductor dies 220 are pressed on and in contact with the first heat dissipation plate 110 and the second heat dissipation plate 120 through the interfaces therebetween in a uniform manner. In the present embodiments, the press forces applied on the first TIM layer 132 and the second TIM layer 134 can be uniformly spread throughout the entire interfaces with the first lug bosses 115 and the second lug bosses 125 instead of being concentrate on the central areas of the interfaces. Through the above configurations, efficiency and uniformity of thermal conduction and dissipation of the heat generated from the heat generating assemblies 200 including the VRMs 210 and the semiconductor dies 220 can be further enhanced.

Figure 2:
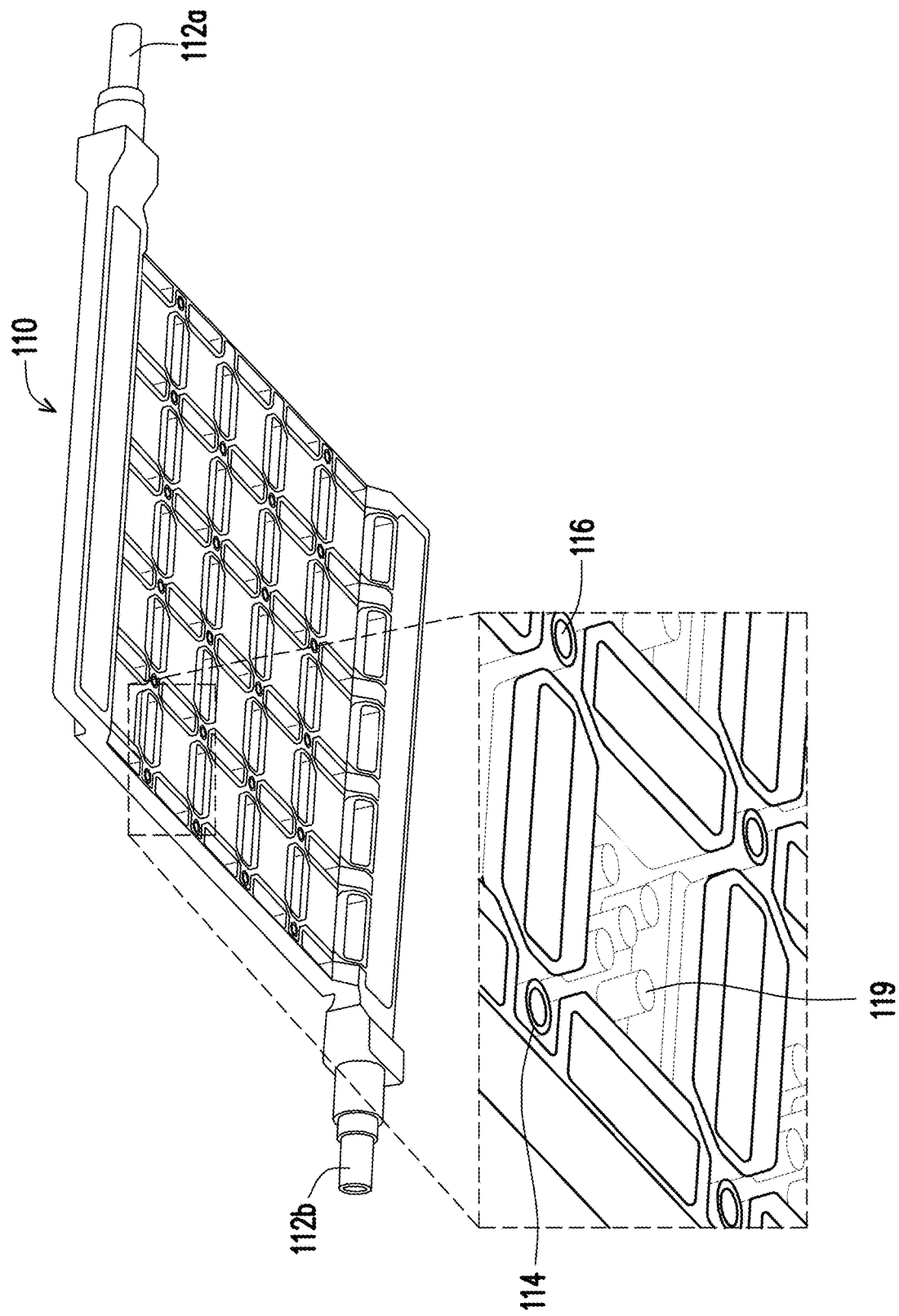
FIG. 2 is a schematic three-dimensional (3D) view illustrating a first heat dissipation plate of the semiconductor package in FIG. 1 in accordance with some embodiments of the disclosure.

FIG. 2 is a schematic three-dimensional (3D) view illustrating a first heat dissipation plate 110 of the semiconductor package 10 in FIG. 1 in accordance with some embodiments of the disclosure. Referring to FIG. 1 and FIG. 2, in some embodiments, a diameter size of the through holes 114 located around the peripheral area of the first heat dissipation plate 110 is greater than a diameter size of the through holes 116 located in the central area of the first heat dissipation plate 110. In some embodiments, referring to FIG. 1 and FIG. 2, the through holes 114 disposed in peripheral area of the first heat dissipation plate 110 can accommodate the fix screws 144 having a diameter size of 4 mm substantially. Moreover, the through holes 115 disposed in central area of the first heat dissipation plate 110 can accommodate the fix screws 146 having a diameter size of 3 mm substantially.

Referring to FIG. 1 and FIG. 2, the first through holes 114 of the first heat dissipation plate 110, the second through holes 124 of the second heat dissipation plate 120, and the through holes 174 of the back plate 170 are vertically aligned with each other correspondingly and have the same diameter size to accommodate the fix screws 144 inserted therein. In addition, the first through holes 116 of the first heat dissipation plate 110, the second through holes 126 of the second heat dissipation plate 120, and the through holes 176 of the back plate 170 are vertically aligned with each other correspondingly and have the same diameter size to accommodate the fix screws 146 inserted therein.

As shown in FIG. 2, the first heat dissipation plate 110 further includes a plurality of blind vias 119 disposed on the first lower surface 113, which accommodate the stop screws 160 extruded from the back plate 170 and respectively press against the first heat dissipation plate 110. In some embodiments, the first heat dissipation plate 110 can be formed by a flexible metal material (e.g., 3003 aluminum alloy or O temper 6000 series aluminum alloy) having a Young's modulus about 50% lower than the commonly used aluminum alloy comprising Cu or Mg, for example, 6061 aluminum alloy. Hence, the first heat dissipation plate 110 is adapted to be pressed and deformed by the stop screws 160 and the fixture components 144, 146.

Figure 3:
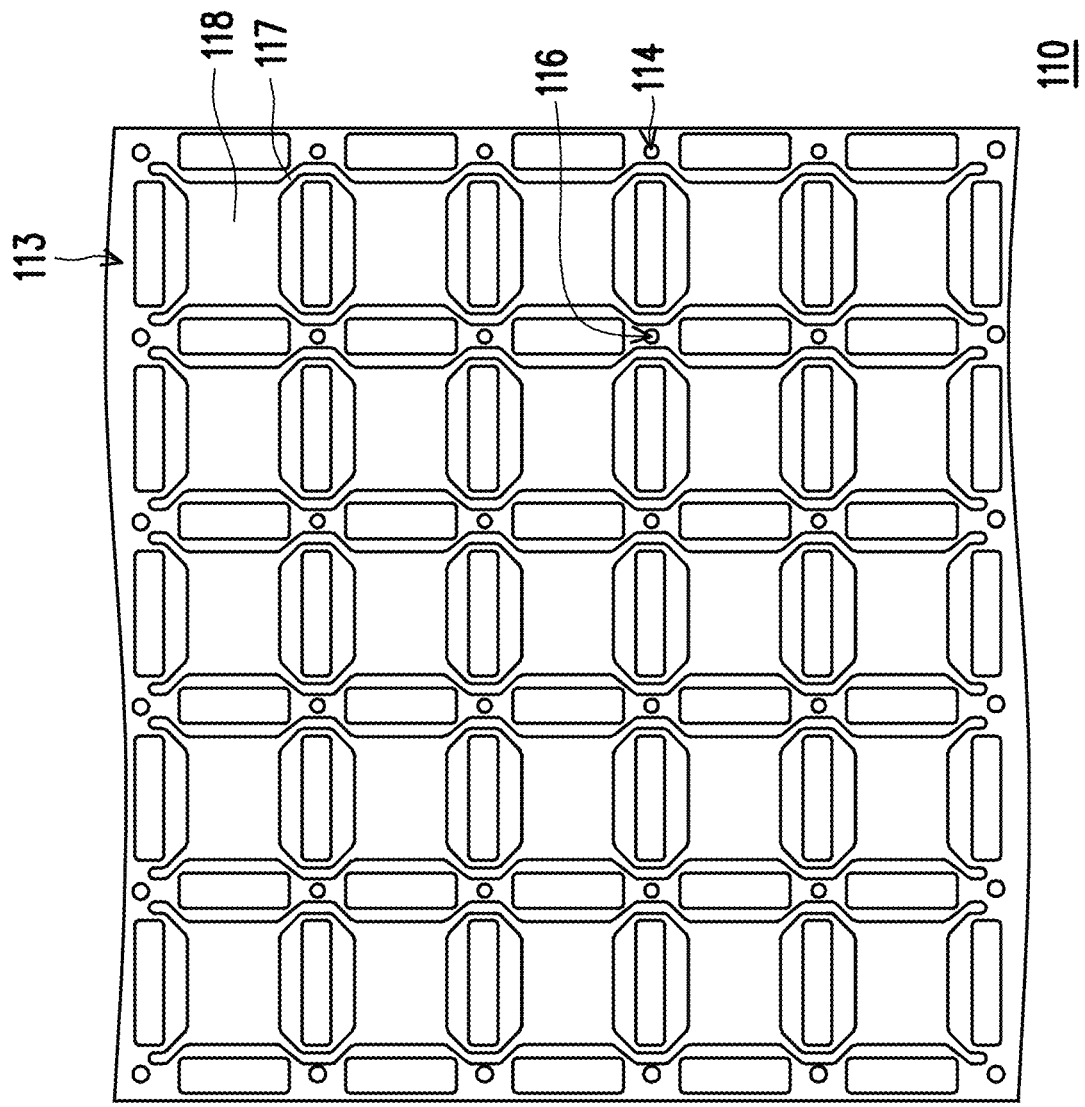
FIG. 3 is a schematic view illustrating a first heat dissipation plate of the semiconductor package 10 illustrated in FIG. 1 in accordance with some embodiments of the disclosure.

FIG. 3 is a schematic view illustrating a first heat dissipation plate 110 of the semiconductor package 10 illustrated in FIG. 1 in accordance with some embodiments of the disclosure. In some embodiments, the first heat dissipation plate 110 can be a cold plate having a cooling fluid (not illustrated) circulated therein. Referring to FIG. 3, in some embodiments, the first heat dissipation plate 110 can include a plurality of cooling fluid pipes 117 and cooling fluid tanks 118. Referring to FIG. 2 and FIG. 3, in some embodiments, the cooling fluid enters the cooling fluid pipes 117 and the cooling fluid tanks 118 through an inlet 112a and exits through an outlet 112b. As shown in FIG. 3, the cooling fluid pipes 117 are curvedly extended in the first heat dissipation plate 110 to avoid interference with the pins of the VRMs 210 protruded from the bottom of the first heat dissipation plate 110. In some embodiments, the heat generated by the VRMs 210 can be transmitted and dissipated into the cooling fluid circulated in the first heat dissipation plate 110 and carried away by the cooling fluid.

Figure 4A:
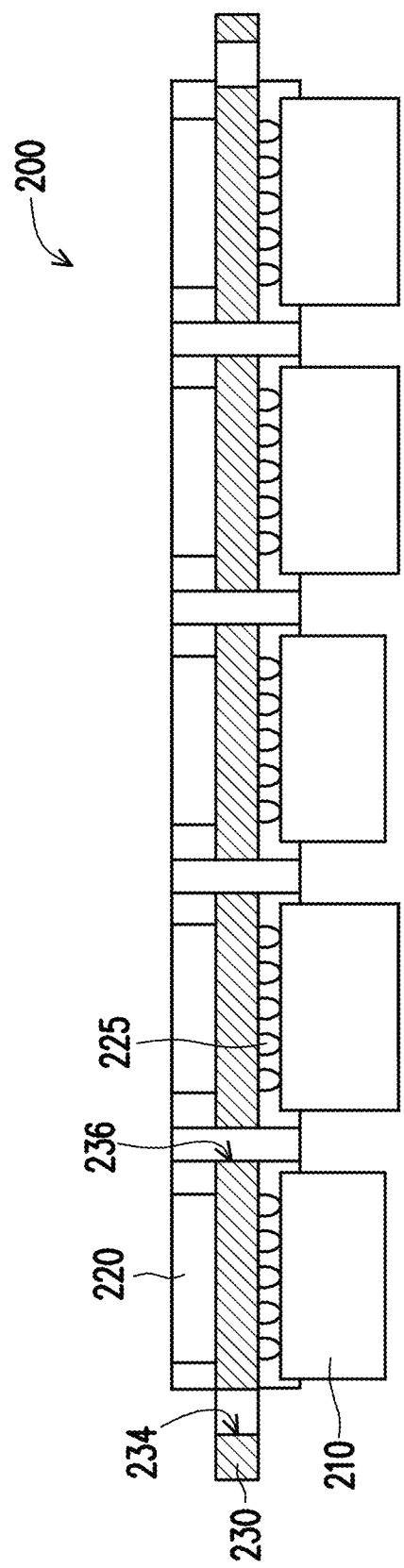
FIG. 4A is a schematic view illustrating a manufacturing process of a semiconductor package in accordance with some embodiments of the disclosure.

FIG. 4A is a schematic view illustrating a manufacturing process of a semiconductor package 10 illustrated in FIG. 1 in accordance with some embodiments of the disclosure. In some embodiments, in a manufacturing process of the semiconductor package 10, a plurality of heat generating assemblies 200 respectively including the VRMs 210 and the semiconductor dies 220 are provided. Moreover, the wafer substrate 230 including through holes 234, 236 is disposed between the VRMs 210 and the semiconductor dies 220. In the present embodiments, the wafer substrate 230 with the integrated fan-out (inFO) structure is provided, and the VRMs 210 can be soldered joint on the wafer substrate 230 through the connecting elements 225.

Figure 4B:
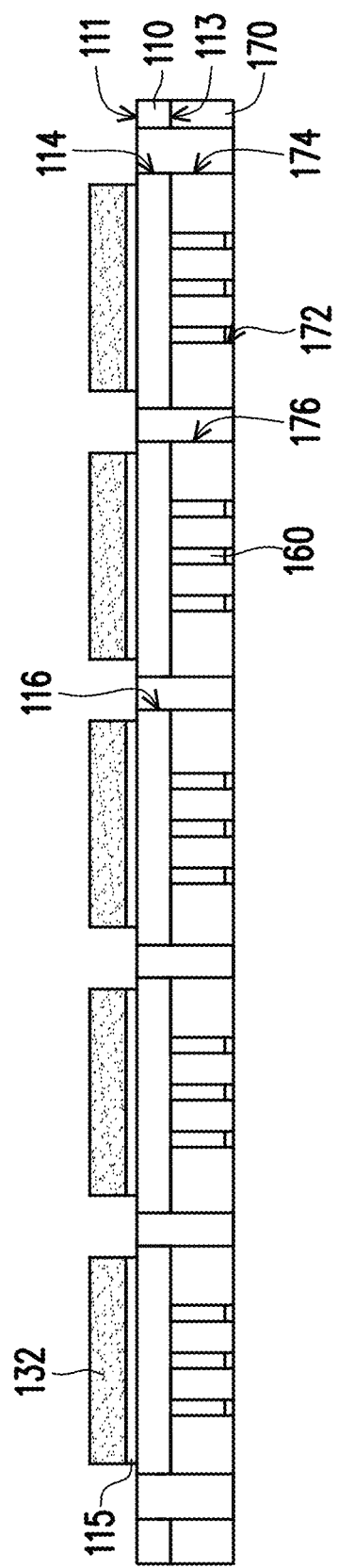
FIG. 4B is a schematic view illustrating a manufacturing process of a semiconductor package in accordance with some embodiments of the disclosure.

FIG. 4B is a schematic view illustrating a manufacturing process of a semiconductor package 10 in accordance with some embodiments of the disclosure. Referring to FIG. 4B, the first heat dissipation plate 110 with the back plate 170 disposed below the first lower surface 113 thereof is provided. In some embodiments, the first heat dissipation plate 110 includes the first lug bosses 115 protruded from the first upper surface 111 of the first heat dissipation plate 110. In addition, the first TIM layer 132 is formed on the first lug bosses 115. As shown in FIG. 4B, the first heat dissipation plate 110 includes the through holes 114, 116 formed therein, and the back plate 170 includes the through holes 174, 146 formed therein respectively aligned with the through holes 114, 116. In addition, the through vias 172 are formed in the bottom of the back plate 170 to accommodate the stop screws 160. In some embodiments, the strokes of each of the stop screws 160 can be respectively adjusted to contact and press against the first lower surface 113 of the first heat dissipation plate 110.

Figure 4C:
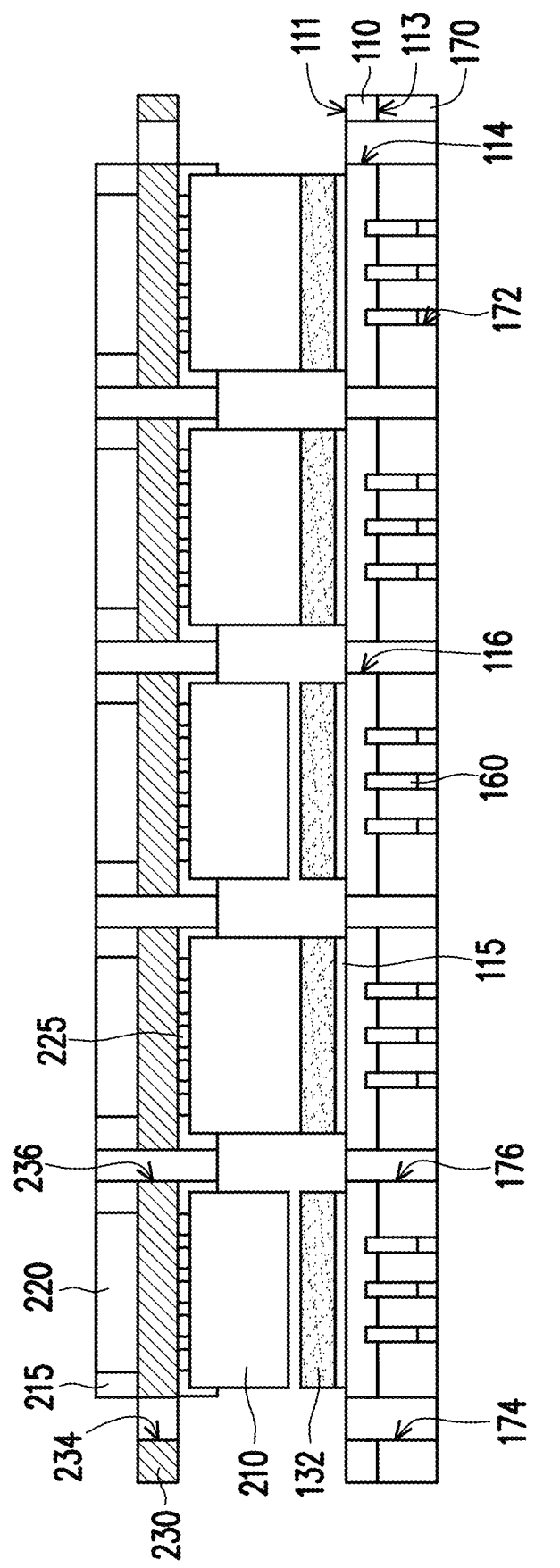
FIG. 4C is a schematic view illustrating a manufacturing process of a semiconductor package in accordance with some embodiments of the disclosure.

FIG. 4C is a schematic view illustrating a manufacturing process of a semiconductor package 10 in accordance with some embodiments of the disclosure. In some embodiments, referring to FIG. 4A to FIG. 4C, the heat generating assemblies 200 are respectively attached to the first lug bosses 115 of the first heat dissipation plate 110 with the first TIM layer 132 disposed therebetween. Depending on the heights of the VRMs 210, gaps might be still existed between some of the VRMs 210 and the first TIM layer 132 as the heat generating assemblies 200 are attached to the first TIM layer 132 and the first lug bosses 115 at the beginning of the process.

Figure 4D:
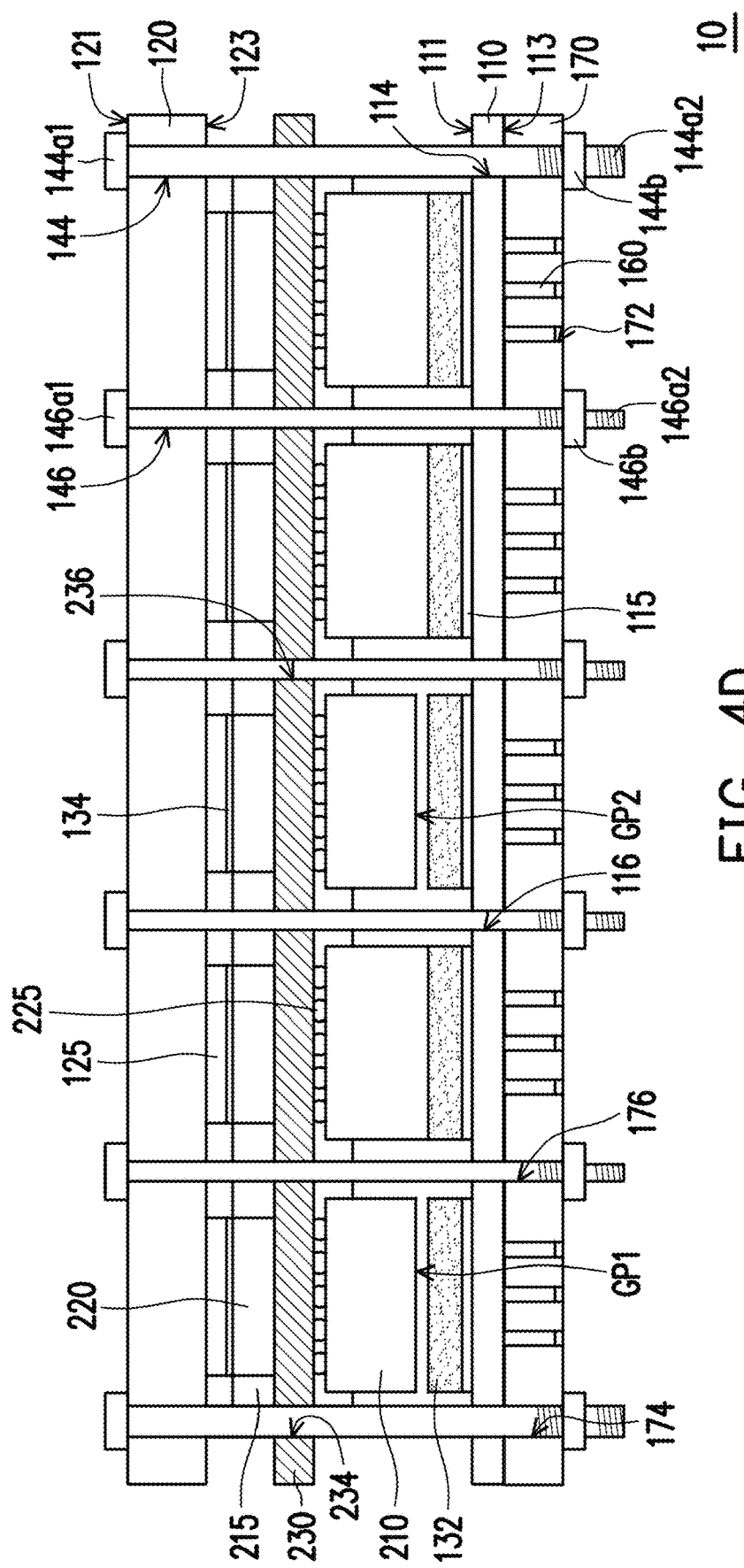
FIG. 4D is a schematic view illustrating a manufacturing process of a semiconductor package in accordance with some embodiments of the disclosure.

FIG. 4D is a schematic view illustrating a manufacturing process of a semiconductor package 10 in accordance with some embodiments of the disclosure. As shown in FIG. 4D, the fix screws 144a, 146a are inserted into the through holes 114, 116 of the first heat dissipation plate 110, the through holes 124, 126 of the second heat dissipation plate 120, the through holes 234, 236 of the wafer substrate 230, and through holes 174, 176 of the back plate 170. Moreover, the tread portions 144a2, 146a2 of the fix screws 144a, 146a are respectively threaded and pre-fixed through the nuts 144b, 146b. As the step of manufacturing process shown in FIG. 4D, the fix screws 144a, 146a are still not fully tightened with the nuts 144b, 146b, and thus the gaps GP1, GP2 having different heights are existed between the VRMs 210 of the heat generating assemblies 200 and the first TIM layer 132 formed on the first lug bosses 115.

Figure 4E:
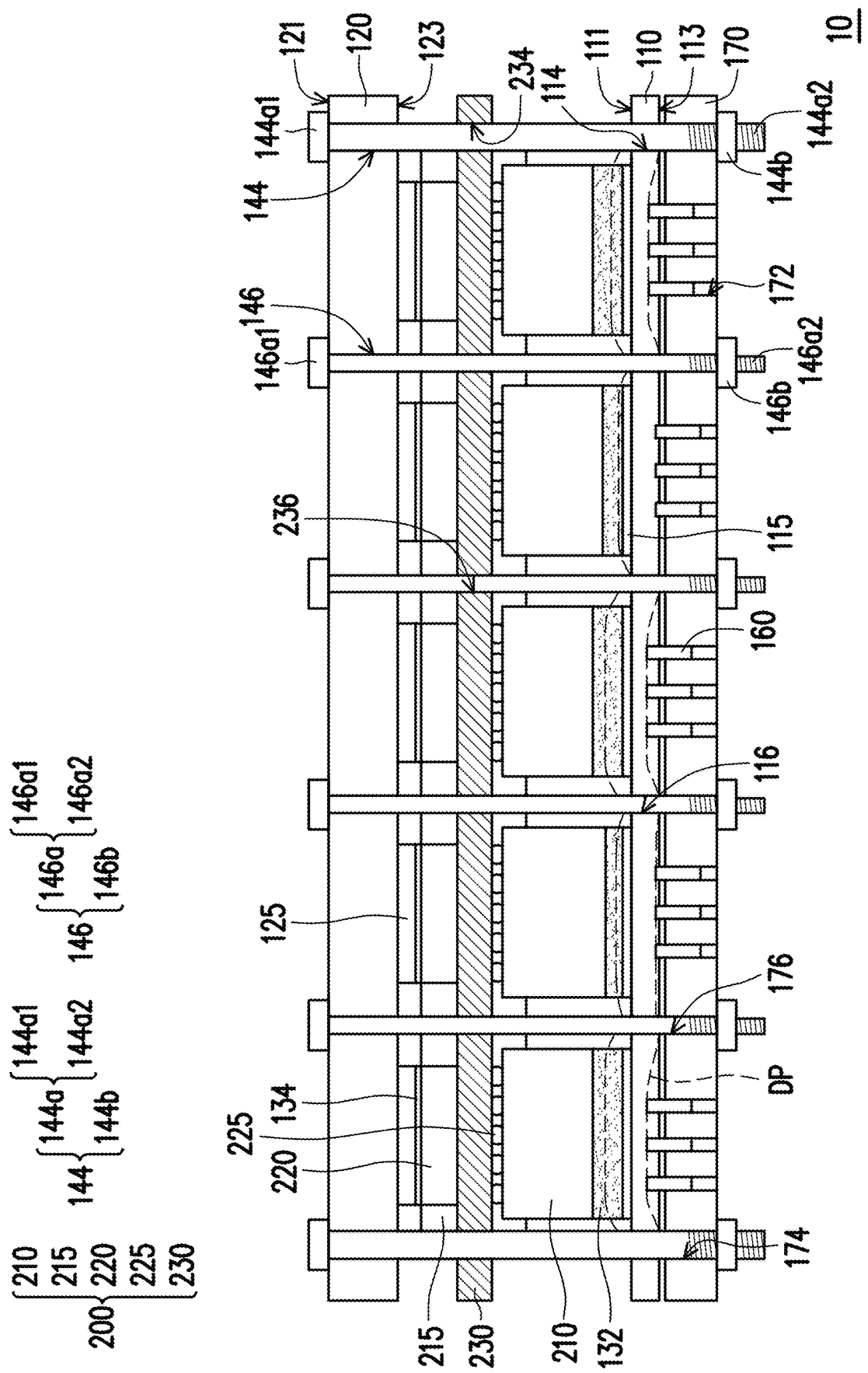
FIG. 4E is a schematic view illustrating a manufacturing process of a semiconductor package in accordance with some embodiments of the disclosure.

FIG. 4E is a schematic view illustrating a manufacturing process of a semiconductor package 10 in accordance with some embodiments of the disclosure. As shown in FIG. 4E, the thread portions 144a2, 146a2 of the fix screws 144a, 146a threaded in the nuts 144b, 146b are respectively further fastened by applying different torques, and the nuts 144b, 146b are respectively pressed against the bottom of the back plate 170. In addition, the screw heads 144a1, 146a1 are respectively pressed against the second upper surface 121 of the second heat dissipation plate 120 to fasten the fix screws 144a, 146a.

Referring again to FIG. 4E, through further fastening the fix screws 144a, 146a to the nuts 144b, 146b respectively by different torques and strokes to compensate the height differences between the various VRMs 210, the gaps GP1, GP2 respectively existed between the VRMs 210 and the first TIM layer 132 on the first lug bosses 115 can be eliminated, so that the VRMs 210 can be uniformly attached to and pressed on the first TIM layer 132 and the first lug bosses 115 of the first heat dissipation plate 110.

Referring again to FIG. 4D and FIG. 4E, in the present embodiments, the VRMs 210 respectively have different heights along a stacking direction of the first heat dissipation plate 110 and the second heat dissipation plate 120. The difference of the heights of the VRMs 210 are originated from the original production tolerance thereof. When the fix screws 144a, 146a are further fastened with the nuts 144b, 146b by applying different strokes and torques, the nuts 144b, 146b are pressed against the first lower surface 113 of the first heat dissipation plate 110. In addition, the production tolerance of the VRMs 210 can be further compensated through disposing the first TIM layer 132 having various thicknesses on the first lug bosses 115. As a result, the first heat dissipation plate 110 can be pushed upward by the nuts 144b, 146b and the stop screws 160 to uniformly attach the first lug bosses 115 to the bottom of the VRMs 210. Hence, the heat generated by the VRMs 210 can be uniformly transmitted and dissipated to the first heat dissipation plate 110 through the first TIM layer 132 disposed therebetween.

Figure 5:
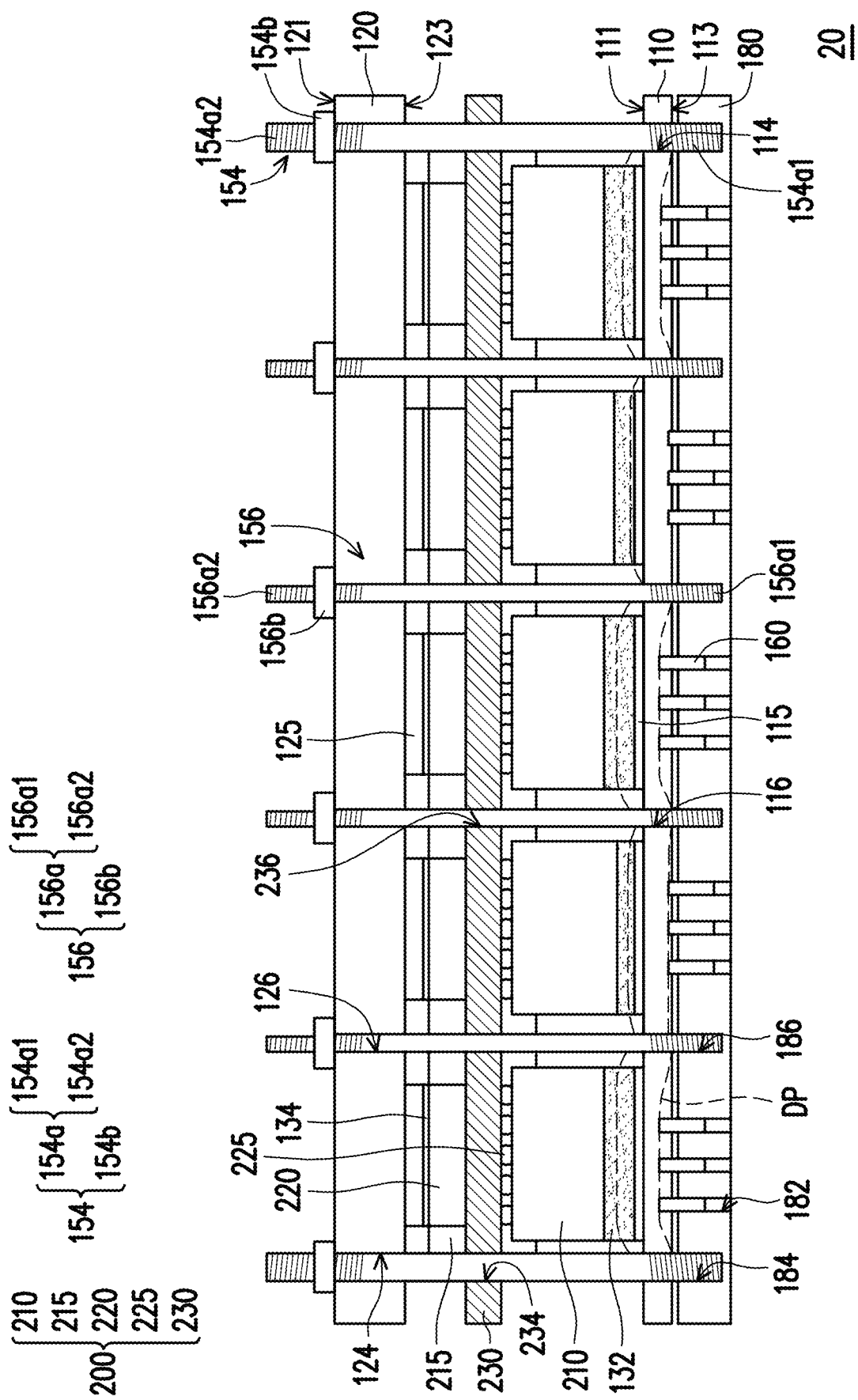
FIG. 5 is a schematic view illustrating a semiconductor package in accordance with some embodiments of the disclosure.

FIG. 5 is a schematic view illustrating a semiconductor package 20 in accordance with some embodiments of the disclosure. Referring to FIG. 5, in the current embodiments, the difference between the semiconductor package 20 and the semiconductor package 10 is that the semiconductor package 20 includes a back plate 180, and the back plates 180 includes a plurality of blind holes 184, 186 for accommodating fixture components 154, 156. Referring to FIG. 5, in some embodiments, the fixture components 154, 156 respectively include fix screws 154a, 156a and nuts 154b, 156b.

In the present embodiments, the fix screws 154a, 156a includes an upper tread portions 154a2, 156a2 and lower tread portions 154a1, 156a1. Referring again to FIG. 5, the lower tread portions 154a1, 156a1 respectively treaded into the blind holes 184, 186 of the back plate 180, and the upper tread portion 154a2, 156a2 respectively treaded in the nuts 154b, 156b. In the present embodiments, the nuts 154b, 156b are respectively pressed against the second upper surface 121 of the second heat dissipation plate 120. In the present embodiments, the lower tread portions 154a1, 156a1 treaded into the blinded holes 184, 186 of the back plate 180 to secure the fix screws 154a, 156a in the back plate 180.

As shown in FIG. 5, the upper tread portion 154a2, 156a2 are treaded through and protruded from the nuts 154b, 156b. The nuts 154b, 156b pressed against the second upper surface 121 of the second heat dissipation plate 120 to push the second lug bosses 125 of the second heat dissipation plate 120 to uniformly attach on the second heat generating components 220, for example, semiconductor dies.

Figure 6A:
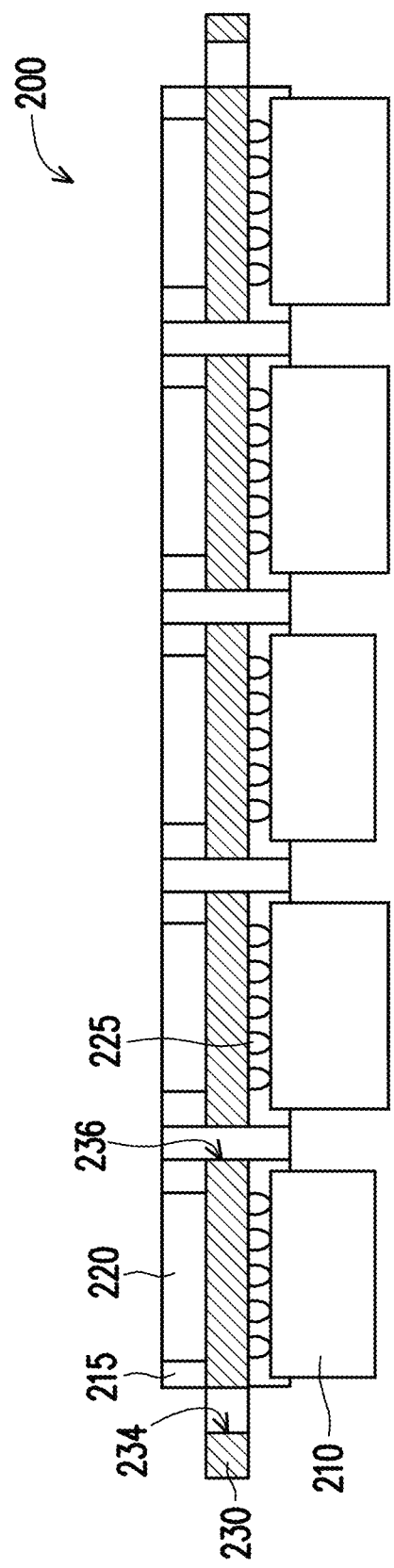
FIG. 6A is a schematic view illustrating a manufacturing process of a semiconductor package in accordance with some embodiments of the disclosure.

FIG. 6A is a schematic view illustrating a manufacturing process of a semiconductor package 20 in accordance with some embodiments of the disclosure. In the manufacturing process of the semiconductor package 20, a plurality of heat generating assemblies 200 respectively including the VRMs 210 and the semiconductor dies 220 are provided. Moreover, the wafer substrate 230 including through holes 234, 236 can be disposed between the VRMs 210 and the semiconductor dies 220. In the manufacturing process of the semiconductor package 20, the wafer 230 with integrated fan-out (inFO) structure is provided, and the VRMs 210 can be soldered on the wafer 230.

Figure 6B:
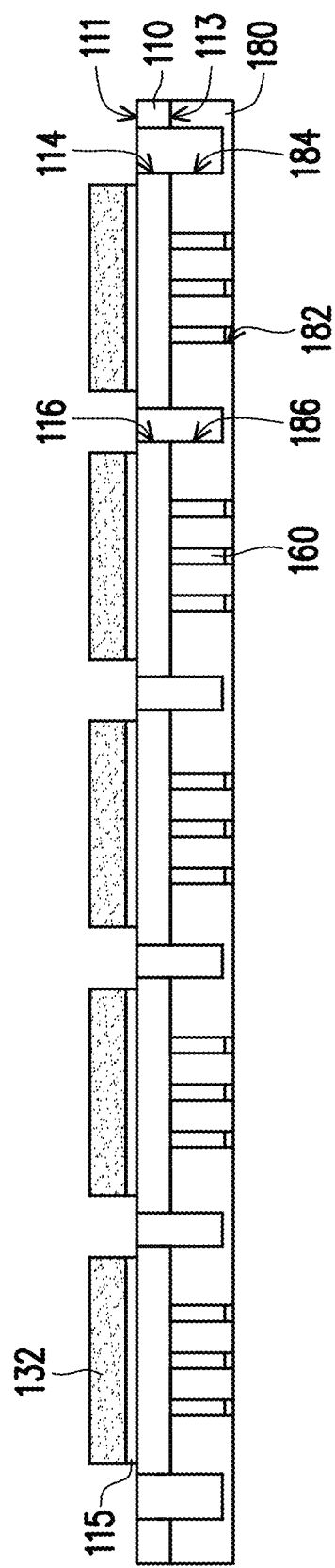
FIG. 6B is a schematic view illustrating a manufacturing process of a semiconductor package in accordance with some embodiments of the disclosure.

FIG. 6B is a schematic view illustrating a manufacturing process of a semiconductor package 20 in accordance with some embodiments of the disclosure. Referring to FIG. 6B, the first heat dissipation plate 110 with the back plate 180 disposed below the first lower surface 113 thereof is provided. In some embodiments, the first heat dissipation plate 110 includes the first lug bosses 115 protruded from the first upper surface 111 of the first heat dissipation plate 110. In addition, the first TIM layer 132 is disposed on the first lug bosses 115. As shown in FIG. 6B, the first heat dissipation plate 110 includes the through holes 114, 116, and the back plate 180 includes the through holes 184, 186 respectively aligned with the through holes 114, 116 of the first heat dissipation plate 110. The through vias 182 are further formed in the back plate 180 for accommodating the stop screws 160. As shown in FIG. 6B, the stroke of each of the stop screws 160 can be adjusted to contact and press against the first lower surface 113 of the first heat dissipation plate 110.

Referring again to FIG. 6B, the blind holes 184, 186 are respectively formed in the back plate 180 for accommodating the fix screws 152, 154 protruded from the first lower surface 113 of the first heat dissipation plate 110.

Figure 6C:
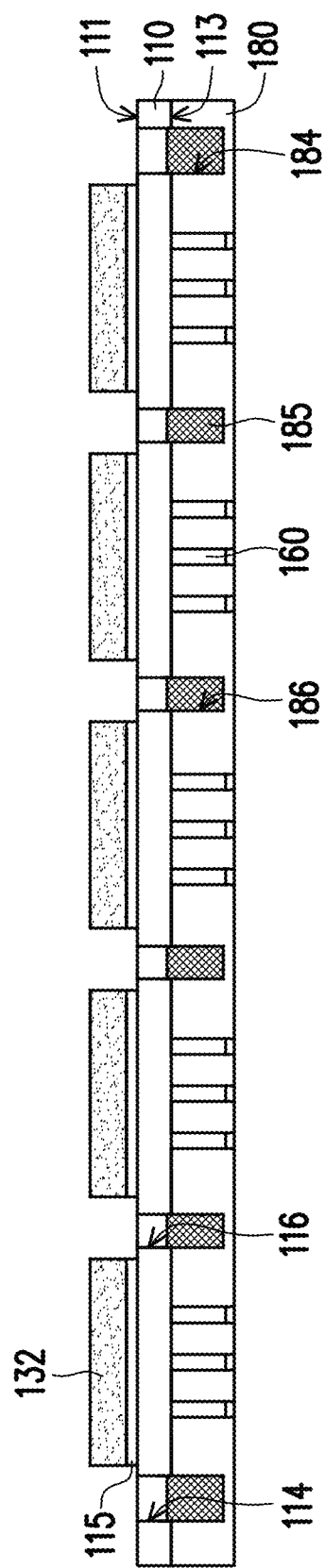
FIG. 6C is a schematic view illustrating a manufacturing process of a semiconductor package in accordance with some embodiments of the disclosure.

FIG. 6C is a schematic view illustrating a manufacturing process of a semiconductor package 20 in accordance with some embodiments of the disclosure. In some embodiments, referring to FIG. 6C, a thread locking fluid 185, for example an anaerobic adhesive, is filled into the blind holes 184, 186 for firmly securing the fix screws 154, 156 inside of the blind holes 184, 186.

Figure 6D:
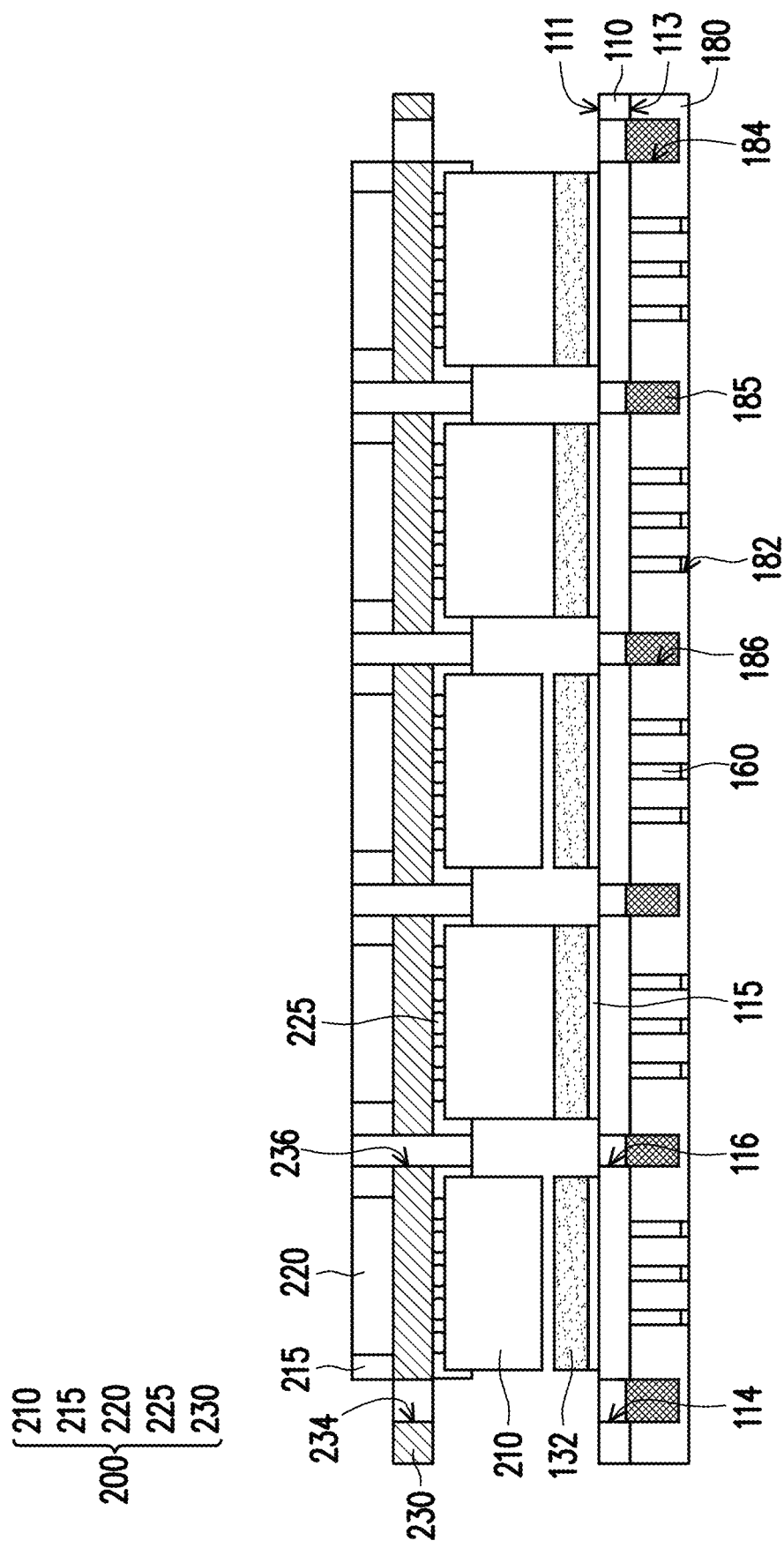
FIG. 6D is a schematic view illustrating a manufacturing process of a semiconductor package in accordance with some embodiments of the disclosure.

FIG. 6D is a schematic view illustrating a manufacturing process of a semiconductor package 20 in accordance with some embodiments of the disclosure. Referring to FIG. 6D, the heat generating assemblies 200 are respectively attached to the first lug bosses 115 of the first heat dissipation plate 110 with the first TIM layer 132 disposed therebetween. Depending on the heights of the VRMs 210, gaps might be still existed between some of the VRMs 210 and the first TIM layer 132 as the heat generating assemblies 200 are attached to the first TIM layer 132 and the first lug bosses 115 at the beginning of the process.

Figure 6E:
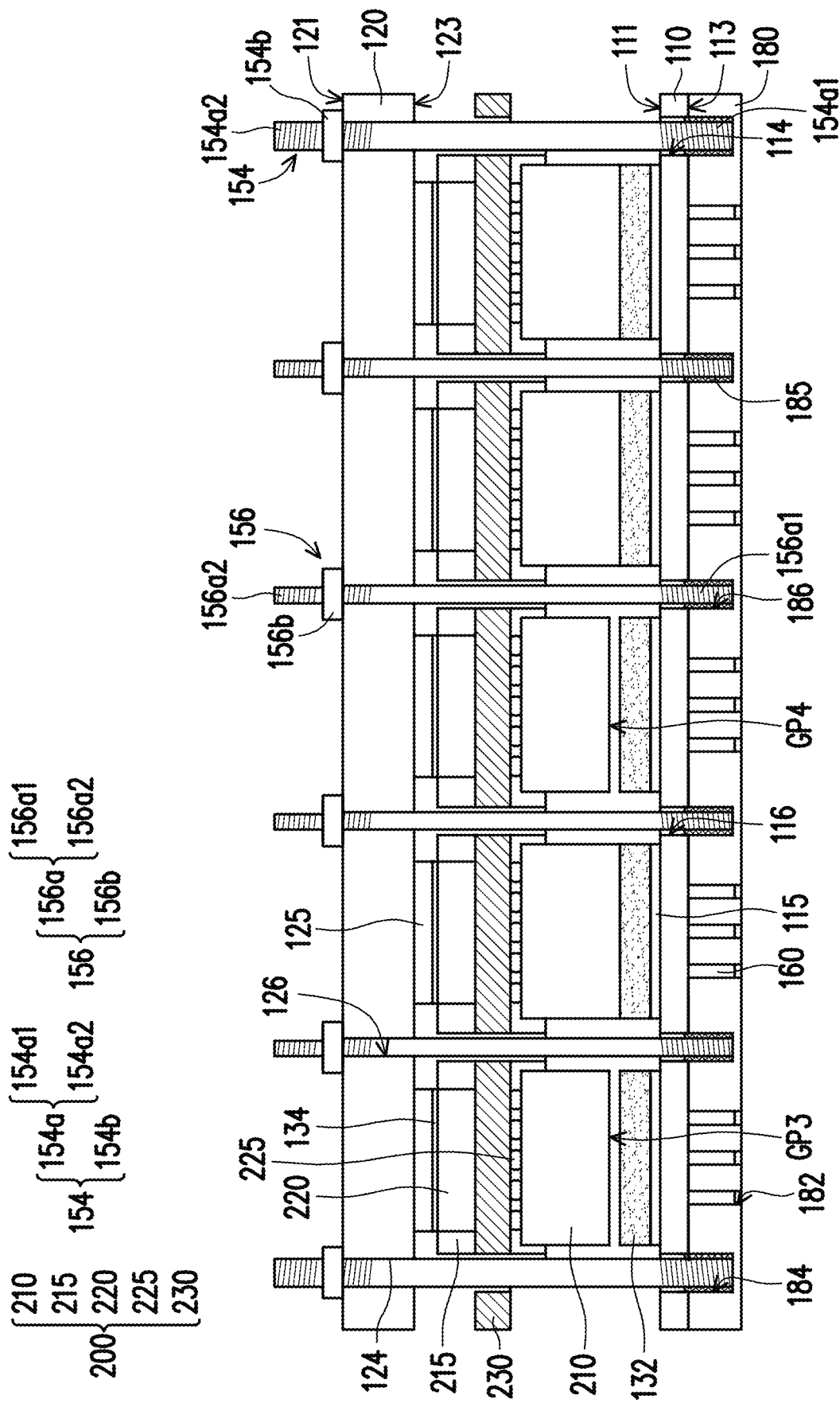
FIG. 6E is a schematic view illustrating a manufacturing process of a semiconductor package in accordance with some embodiments of the disclosure.

FIG. 6E is a schematic view illustrating a manufacturing process of a semiconductor package 20 in accordance with some embodiments of the disclosure. As shown in FIG. 6E, the fix screws 154, 156 are respectively inserted through the through holes 114, 116 of the first heat dissipation plate 110 and the through holes 124, 126 of the second heat dissipation plate 120. Moreover, the lower threaded portion 154a1, 156a1 of the fix screws 154a, 156a are respectively threaded and pre-fixed into the blind holes 184, 186. In some embodiments, the nuts 154b, 156b are respectively treaded with the upper treaded portions 154a2, 156a2 of the fix screws 154a, 156a, and the upper treaded portions 154a2, 156a2 are further protruded from the nuts 154a, 156b along a direction away from the second heat dissipation plate 120. As shown in FIG. 6E, the fix screws 154, 156 are not fully tightened in the nuts 154b. 156b, and thus a plurality of gaps GP3, GP4 having different heights may be existed between the various VRMs 210 of the heat generating assemblies 200 and the first TIM layer 132 on the first lug bosses 115 due to variation in the heights of the VRMs 210 originated from production tolerance.

Figure 6F:
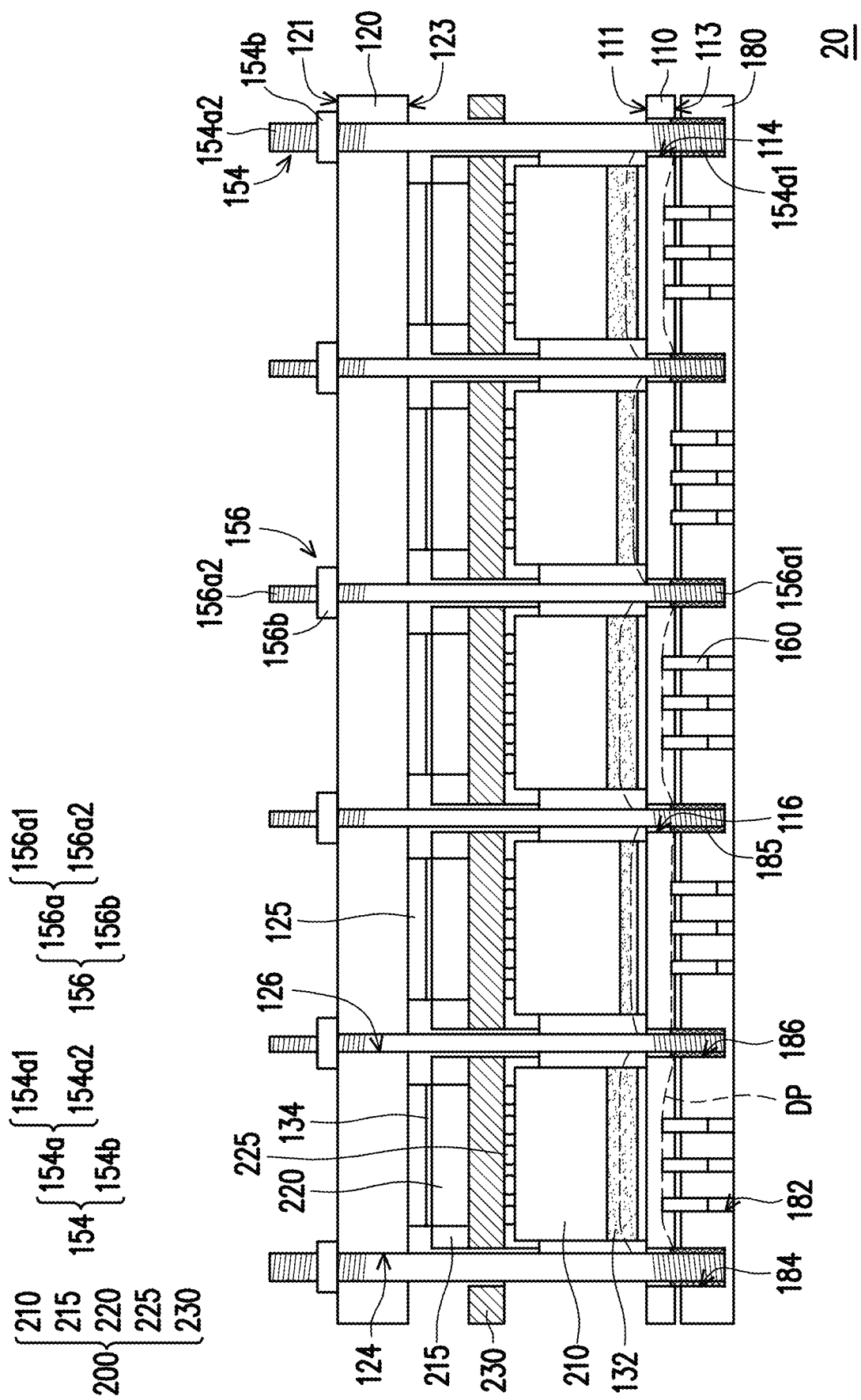
FIG. 6F is a schematic view illustrating a manufacturing process of a semiconductor package in accordance with some embodiments of the disclosure.

FIG. 6F is a schematic view illustrating a manufacturing process of a semiconductor package 20 in accordance with some embodiments of the disclosure. As shown in FIG. 6F, the fix screws 154a, 156a inserted through the nuts 154b, 156b are further treaded in various strokes and fastened by different torques. The nuts 154b, 156b are respectively pressed against the second upper surface 121 of the second heat dissipation plate 120. In addition, the lower tread portions 154a1, 156a1 are inserted into the blind holes 184, 186 of the back plate 180 and firmly secured therein through the thread locking fluids 185.

Referring again to FIG. 6F, through further fastening the fix screws 154a, 156a to the nuts 154b, 156b, the gaps GP3, GP4 respectively existed between the VRMs 210 and the first TIM layer 115 can be eliminated by applying various torques to the nuts 152b, 154b, so that the nuts 152b, 154b respectively different strokes in relative to the upper tread portions 154a2, 156a2. As a result, the VRMs 210 can be uniformly attached to and pressed against the first lug bosses 115 with the first TIM layer 132 disposed therebetween, and the upper surfaces of the semiconductor dies 220 are attached to the second lug bosses 125 of the second heat dissipation plate 120.

Referring again to FIG. 6E and FIG. 6F, in the present embodiments, when the fix screws 154a, 156a are further fastened with the nuts 154b, 156b by applying different strokes and torques through for examples a screw tightening machine, the nuts 154b, 156b are pressed against the second upper surface 121 of the second heat dissipation plate 120. As a result, the second heat dissipation plate 120 can be pushed by the nuts 154b, 156b toward the heat generating assemblies 200. The stop screws 160 are pressed on the first lower surface 113 of the first heat dissipation plate 110 to the deformed positions DP thereof. Through the above configurations, the bottom surfaces of the VRMs 210 are unfirmly attached to the first lug bosses 115 and first TIM layer 132 disposed therebetween, and the upper surfaces of the semiconductor dies 220 are uniformly attached to the second lug bosses 125. Hence, the heat generated by the VRMs 210 and the semiconductor dies 220 can be uniformly transmitted and dissipated to the first heat dissipation plate 110 and the second heat dissipation plate 120 respectively through the first TIM layer 132 and the second TIM layer 134. Through above steps of the manufacturing process, the semiconductor package 20 is fully formed.

In accordance with some embodiments, a semiconductor package includes a first heat dissipation plate, a second heat dissipation plate, a plurality of heat generating assemblies, and a plurality of fixture components. The first heat dissipation plate has a first upper surface and a first lower surface. The first heat dissipation plate includes first through holes, and each of the first through holes is extended from the first upper surface to the first lower surface. The second heat dissipation plate has a second upper surface and a second lower surface. The second heat dissipation plate includes second through holes, and each of the second through holes is extended from the second upper surface to the second lower surface and aligned with one of the first through holes. The heat generating assemblies are disposed between the first heat dissipation plate and the second heat dissipation plate. Each of the heat generating assemblies includes a semiconductor die disposed on the second lower surface. The fixture components include fix screws and nuts. The fix screws respectively include screw heads and thread portions connected with each other, and the fix screws penetrate through the first heat dissipation plate and the second heat dissipation plate along the first through holes and the second through holes. The thread portions of the fix screws are respectively threaded through the nuts and protruded therefrom along a direction away from the first lower surface, and the screw heads are pressed against the second upper surface to fixedly secure the heat generating assemblies between the first heat dissipation plate and the second heat dissipation plate.

In accordance with some embodiments, a semiconductor package includes a first heat dissipation plate, a plurality of first heat generating components, a second heat dissipation plate, a plurality of second heat generating components, a back plate, and a plurality of fixture components. The first heat dissipation plate has a first upper surface and a first lower surface. The first heat dissipation plate includes first lug bosses and first through holes. Each of the first through holes is extended from the first upper surface to the first lower surface, and each of the first lug bosses is protruded from the first upper surface. The first heat generating components are respectively disposed on the first lug bosses. The second heat dissipation plate has a second upper surface and a second lower surface. The second heat dissipation plate includes second lug bosses and second through holes. Each of the second through holes is extended from the second upper surface to the second lower surface, and each of the second lug bosses is protruded from the second lower surface. The second heat generating components are respective disposed on the second lug bosses and between the first generating components and the second heat dissipation plate. The back plate is disposed below the first lower surface of the first heat generating components. The fixture components include fix screws and nuts. The fix screws penetrate through the first heat dissipation plate, the second heat dissipation plate, and the back plate along the first through holes and the second through holes, and the fix screws are protruded from the back plate along a direction away from the first lower surface. The fix screws are respectively threaded through the nuts, and the nuts are pressed against the back plate to fixedly secure the first heat generating components and the second heat generating components between the first heat dissipation plate and the second heat dissipation plate.

In accordance with some embodiments, a semiconductor package includes a first heat dissipation plate, a second heat dissipation plate, a plurality of heat generating assemblies, a back plate, and a plurality of fixture components. The first heat dissipation plate has a first upper surface and a first lower surface. The first heat dissipation plate includes first lug bosses and first through holes. Each of the first through holes is extended from the first upper surface to the first lower surface, and each of the first lug bosses is protruded from the first upper surface. The second heat dissipation plate has a second upper surface and a second lower surface. The second heat dissipation plate includes second lug bosses and second through holes. Each of the second through holes is extended from the second upper surface to the second lower surface, and each of the second lug bosses is protruded from the second lower surface. The heat generating assemblies are respectively disposed between the first lug bosses and the second lug bosses. The back plate is disposed below the first lower surface of the first heat dissipation plate. The back plate includes a plurality of blind holes respectively aligned with the first through holes and the second through holes. The fixture components include fix screws and nuts. The fix screws penetrate through the first heat dissipation plate and the second heat dissipation plate along the first through holes and the second through holes and treaded into the blind holes of the back plate. The fix screws are respectively threaded through the nuts to fixedly secure the heat generating assemblies between the first heat dissipation plate and the second heat dissipation plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first heat dissipation plate having a first upper surface and a first lower surface, wherein the first heat dissipation plate comprises first lug bosses and first through holes, wherein each of the first through holes is extended from the first upper surface to the first lower surface, and each of the first lug bosses is protruded from the first upper surface;
   a plurality of first heat generating components, respectively disposed on the first lug bosses;
   a second heat dissipation plate having a second upper surface and a second lower surface, wherein the second heat dissipation plate comprises second lug bosses and second through holes, wherein each of the second through holes is extended from the second upper surface to the second lower surface, and each of the second lug bosses is protruded from the second lower surface;
   a plurality of second heat generating components, respectively disposed on the second lug bosses and between the first heat generating components and the second heat dissipation plate;
   a back plate disposed below the first lower surface of the first heat dissipation plate; and
   a plurality of fixture components, comprising fix screws and nuts, wherein the fix screws penetrate through the first heat dissipation plate, the second heat dissipation plate, and the back plate along the first through holes and the second through holes, and the fix screws are protruded from the back plate along a direction away from the first lower surface,
   wherein the fix screws are respectively threaded through the nuts, and the nuts are pressed against the back plate to fixedly secure the first heat generating components and the second heat generating components between the first heat dissipation plate and the second heat dissipation plate.

2. The semiconductor package as claimed in claim 1, wherein each of the first heat generating components comprises a voltage regulator module.

3. The semiconductor package as claimed in claim 2, wherein the voltage regulator module of each of the first heat generating components has a different height along a stacking direction of the first heat dissipation plate and the second heat dissipation plate.

4. The semiconductor package as claimed in claim 1, wherein each of the second heat generating components comprises a semiconductor die.

5. The semiconductor package as claimed in claim 1, wherein a first thermal interface material layer is disposed between the first heat generating components and the first lug bosses.

6. The semiconductor package as claimed in claim 1, wherein gap heights between the first heat generating components and the first lug bosses are respectively different from each other.

7. The semiconductor package as claimed in claim 1, further comprising a wafer substrate disposed between the first heat generating components and the second heat generating components.

8. The semiconductor package as claimed in claim 1, wherein the second heat dissipation plate is a continuous plate extended in a lateral direction of the semiconductor package and fully covers the plurality of heat generating assemblies.

9. A semiconductor package, comprising:
   a first heat dissipation plate having a first upper surface and a first lower surface, wherein the first heat dissipation plate comprises first lug bosses and first through holes, wherein each of the first through holes is extended from the first upper surface to the first lower surface, and each of the first lug bosses is protruded from the first upper surface;
   a plurality of first heat generating components, respectively disposed on the first lug bosses;
   a second heat dissipation plate having a second upper surface and a second lower surface, wherein the second heat dissipation plate comprises second lug bosses and second through holes, wherein each of the second through holes is extended from the second upper surface to the second lower surface, and each of the second lug bosses is protruded from the second lower surface;
   a plurality of second heat generating components, respectively disposed on the second lug bosses and between the first heat generating components and the second heat dissipation plate;
   a back plate disposed below the first lower surface of the first heat dissipation plate; and
   a plurality of fixture components, comprising fix screws and nuts, wherein the fix screws penetrate through the first heat dissipation plate, the second heat dissipation plate, and the back plate along the first through holes and the second through holes, and the fix screws are protruded from the back plate along a direction away from the first lower surface,
   wherein the fix screws are respectively threaded through the nuts, and the nuts are pressed against the back plate to fixedly secure the first heat generating components and the second heat generating components between the first heat dissipation plate and the second heat dissipation plate, wherein each of the heat generating assemblies further comprises a voltage regulator module disposed on the first upper surface and between the semiconductor die and the first heat dissipation plate, wherein the voltage regulator modules respectively have different heights along a stacking direction of the first heat dissipation plate and the second heat dissipation plate.

10. The semiconductor package as claimed in claim 9, wherein the second heat dissipation plate is a continuous plate extended in a lateral direction of the semiconductor package and fully covers the plurality of heat generating assemblies.

11. The semiconductor package as claimed in claim 9, further comprising a wafer substrate disposed between the first heat generating components and the second heat generating components.

12. The semiconductor package as claimed in claim 9, wherein gap heights between the first heat generating components and the first lug bosses are respectively different from each other.

* * * * *